United States Patent [19]
Toyonaga

[11] Patent Number: 5,999,716
[45] Date of Patent: Dec. 7, 1999

[54] LSI LAYOUT DESIGN METHOD CAPABLE OF SATISFYING TIMING REQUIREMENTS IN A REDUCED DESIGN PROCESSING TIME

[75] Inventor: Masahiko Toyonaga, Hyogo, Japan

[73] Assignee: Matsushita Electric Industrial Co., Ltd., Osaka, Japan

[21] Appl. No.: 08/883,583

[22] Filed: Jun. 26, 1997

[30] Foreign Application Priority Data

Jun. 27, 1996 [JP] Japan .................................. 8-167250

[51] Int. Cl.⁶ .................................................. G06F 17/50
[52] U.S. Cl. ................................ 395/500.11; 395/500.1; 395/500.12; 395/500.03; 395/500.09
[58] Field of Search ..................................... 364/488, 489, 364/490, 491; 395/500.11, 500.1, 500.09, 500.03, 500.12

[56] References Cited

U.S. PATENT DOCUMENTS

| | | | |
|---|---|---|---|
| 5,179,643 | 1/1993 | Homma et al. | 395/140 |
| 5,521,836 | 5/1996 | Hartoog et al. | 364/491 |
| 5,555,188 | 9/1996 | Chakradhar | 364/490 |
| 5,757,658 | 5/1998 | Rodman et al. | 364/491 |
| 5,764,528 | 6/1998 | Nakamura | 364/489 |
| 5,778,216 | 7/1998 | Venkatesh | 395/558 |
| 5,787,268 | 7/1998 | Sugiyama et al. | 395/500 |

OTHER PUBLICATIONS

Eurich et al "EDIF grows up," IEEE, pp. 68–72, Nov. 1990.
Itoh et al "Ale: A Layout Generating and Editing System for Analog LSIs," IEEE, pp. 843–846, 1990.

*Primary Examiner*—Kevin J. Teska
*Assistant Examiner*—Vuthe Siek
*Attorney, Agent, or Firm*—McDermott, Will & Emery

[57] ABSTRACT

An LSI layout design technique is disclosed which has the ability to satisfy LSI timing constraints in a short processing time. A netlist descriptive of a target circuit that is designed is fed to a computer, and a flip-flop netlist representing information about connections among flip-flops relating to the timing constraints, is generated from the netlist. Such a flip-flop netlist is generated by clustering using a flip-flop as a seed. According to the generated flip-flop netlist, each flip-flop is placed and a flip-flop region to place therein a cell relating to a flip-flop is determined. A cell relating to a corresponding flip-flop is placed in a flip-flop region and the cell arrangement is improved throughout the placement region. Based on the improved cell arrangement, a layout is designed.

5 Claims, 13 Drawing Sheets

PLACEMENT REGION

FLIP-FLOP REGION

PLACEMENT REGION

FLIP-FLOP REGION

LSI LAYOUT DESIGN METHOD CAPABLE OF SATISFYING TIMING REQUIREMENTS IN A REDUCED DESIGN PROCESSING TIME

BACKGROUND OF THE INVENTION

This invention relates to LSI layout design technology in the design of large scale integrated (LSI) circuits. It relates particularly to an LSI layout design method capable of meeting timing constraints.

In the layout design of an LSI circuit for use by high-performance information apparatus, a placement of cells is carried out in order of meeting timing constraints which assure the fast clock operation of sync circuits. Such placement, known in the art as a "timing driven placement" becomes important in the layout design of LSI circuits.

A typical timing driven placement method is described. A term for evaluation of the length of a connection line relating to a signal path with the maximum delay (i.e., a critical path) of signal paths in a combinational circuit that has an effect on timing, is added to a function of placement evaluation for circuit area and connection line length evaluation, and the placement of cell is repeatedly improved to minimize the function of placement evaluation.

The above-described method is problematic. In the conventional method, not only timing but also circuit area is evaluated. This will not give a sure guarantee that the timing constraints are satisfied, therefore leading to producing an undesirable placement result with a partial timing constraints violation. Accordingly, in order to meet the timing constraints without fail, it is necessary to repeat a logic design by, for example, re-synthesis after a layout design is carried out.

Since a meticulous placement improvement must be performed to obtain an optimal placement result, associated processing is a time consuming process. It is difficult to improve the efficiency of LSI design.

The inventors of the present invention devised the following method to provide a solution to the problem with the prior art.

Whether timing constraints are satisfied or not is determined by cell placement and wiring between flip-flops that are a critical path beginning and a critical path end, respectively. The inventors paid attention to this point. Connections among flip-flops relating to the timing constraints are found in advance. Subsequently, placement locations for the flip-flops are determined for optimal timing and a layout design is then carried out. In accordance with this method, instead of performing a layout design of a huge number of cells forming an LSI circuit at a time, a layout design of a less number of flip-flops is carried out. This seems to promise not only a considerable reduction of the processing time but also a layout which does meet the timing constraints.

However, the finding of connections among flip-flops relating to the timing constraints is not easy, and it is difficult to represent the found connections in computer readable form.

For example, a case, in which connections among flip-flops are found from a logical-level netlist shown in FIG. 13(a), is explained. In such a case, the found connections will be given in the form of an approximately complete graph, i.e., in the form of a graph in which each node branches out to all the remaining other nodes (see FIG. 13(b)), for a single combinational circuit provides signals to various flip-flops. For this reason, even when trying to determine a placement location for each of the flip-flops for optimal timing, it is not possible to do so.

The fact that the connections form an approximately complete graph means that each flip-flop is in signal input/output relationship with almost all the other flip-flops. On the other hand, for the timing constraints to be met, it is necessary to place flip-flops, which are a signal flow beginning and a signal flow end, in close proximity with each other. For this reason, if the connections (connection relationship) is approximately a complete graph, this makes it possible to bring the flip-flops in close proximity with each other. However, since areas near the flip-flops are finite, this will not guarantee that every flip-flop is placed at its optimal placement location. Accordingly, it is important that the connections will not take an approximately complete graph form.

SUMMARY OF THE INVENTION

Accordingly, it is an object of the present invention to provide an improved LSI layout design method having the ability to meet LSI timing constraints in a short processing time without fail.

The present invention provides an LSI layout design method comprising the steps of (a) generating a flip-flop netlist which represents connections among flip-flops relating to timing constraints and (b) carrying out a layout design after determining placement locations for flip-flops according to the generated flip-flop netlist.

As a result of such arrangement, an LSI layout which ensures that the timing constraints are satisfied without fail, can be laid out in a short processing time.

The present invention further provides a computer-aided LSI layout design method comprising:

(a) a first step of generating, on the basis of a netlist which represents connections among cells including flip-flops in a circuit that is designed, a flip-flop netlist which represents connections among flip-flops relating to timing constraints;

(b) a second step of placing, according to said flip-flop netlist generated in said first step, flip-flops in a given placement region and determining a flip-flop region for each flip-flop where a cell relating to said flip-flop is to be placed; and (c) a third step of placing, in each flip-flop region determined in said second step, a cell relating to a corresponding flip-flop;

wherein a layout design is performed according to said cells placement carried out in said third step.

In accordance with the present invention, generated from a netlist representing connections between cells including flip-flops in a design-target circuit, is a flip-flop netlist representing connections among the flip-flops relating to timing constraints. According to this flip-flop netlist, each flip-flop is placed and with respect to each flip-flop a flip-flop region to place therein a corresponding cell thereto is determined. The cell is placed in the determined flip-flop region. In other words, since a layout design is carried out after determining placement locations for flip-flops for optimal timing, this makes it possible to design an LSI layout having the ability to meet the timing constraints without fail. Further, in accordance with this method, instead of performing a layout design of a huge number of cells forming an LSI circuit at a time, a layout is designed after designing a placement of a less number of flip-flops. This leads to a considerable reduction of the processing time.

It is preferred that the first step includes:

(a) a step of regarding each critical path between flip-flops as a connection line, deleting cells that belong to the critical path from the netlist, and setting the sum of the areas of the deleted cells to be a weight for the connection line;

(b) a step of deleting from the netlist a cell that does not belong to any of the critical paths and adding the area of the deleted cell to the weight of a connection line corresponding to a critical path in close proximity to the deleted cell;

wherein a flip-flop netlist, made up of flip-flops and a weighted connection line, is generated.

It is preferred that the first step generates the flip-flop netlist by clustering in which a flip-flop is used as a seed.

It is preferred that the first step includes deleting a critical path between flip-flops that does not require timing constraints, from a flip-flop netlist.

The present invention provides an LSI having a layout in which wherein flip-flops are placed apart from one another at intervals depending on the area of cells relating to respective flip-flops and a cell relating to a flip-flop is placed in the vicinity of the flip-flop.

It is preferred that in the foregoing layout each of flip-flops and cells relating to respective flip-flops are placed in Volonoi diagram form.

BRIEF DESCRIPTION OF THE DRAWINGS

FIG. 2, comprised of FIGS. 2(a)–(c), is a flow chart useful in understanding a process of creating a flip-flop (FF) netlist in an LSI layout design method in accordance with an embodiment of the present invention, in which

FIG. 3, comprised of FIGS. 3(a)–(c), is a diagram for describing the FIG. 2(a) process, in which

FIG. 4, comprised of FIGS. 4(a)–(c), is a diagram for describing the FIG. 2(b) process, in which

FIG. 5, comprised of FIGS. 5(a)–(c), is a diagram for describing the FIG. 2(c) process, in which

FIG. 12 is comprised of FIGS. 12(a)–(c) wherein

FIG. 13, comprised of FIGS. 13(a) and (b), is a diagram for describing the reason of why it is difficult to determine placement locations for flip-flops in order of achieving optimal timing, in which

DETAILED DESCRIPTION OF THE INVENTION

Figure 1:
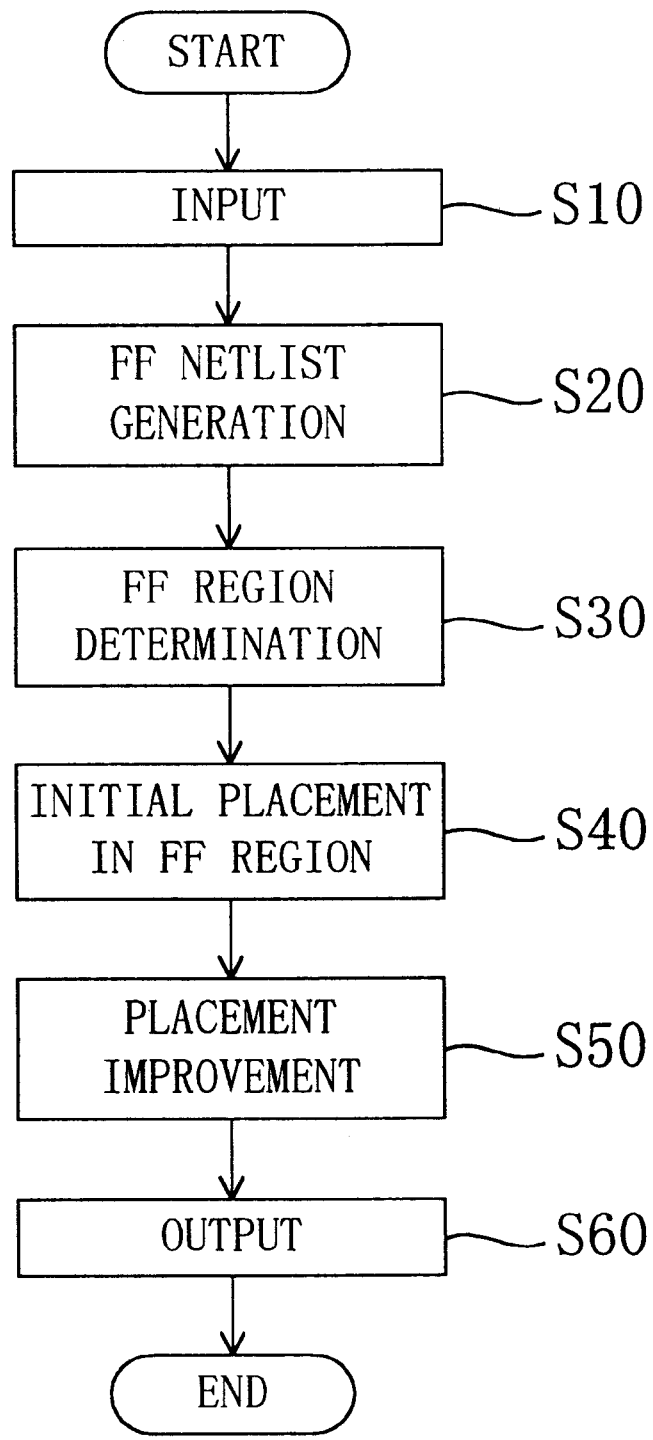
FIG. 1 is a flow chart of the successive processing steps in an LSI layout design method according to an embodiment of the present invention.

FIG. 1 is a flow chart of the successive processing steps in an LSI layout design method according to an embodiment of the present invention. For the sake of simplification, the present embodiment is described in terms of an LSI circuit of the standard cell type.

In step S10, standard cell level netlists, standard cell libraries, and placement conditions are entered. For example, (a) a placement region condition and a timing constraint condition are given as a placement condition, (b) the number of cell columns or the ratio of a placement region's height to its width is described as a placement region condition, and (c) a delay constraint value of a critical path between each flip-flop in a netlist is described as a timing constraint condition. Step S10 forms a first process.

In step S20, a flip-flop (FF) netlist is generated from the standard cell level netlist. The FF netlist represents connections among flip-flops relating to the timing constraints. Cells other than the flip-flops are deleted from the FF netlist.

In step S30, each of the flip-flops is placed within a given placement region according to the FF netlist generated in step S20 and is assigned a respective flip-flop (FF) region which is a region where a corresponding cell is placed.

In step S40, each of the cells which were deleted from the FF netlist in step S20, is initially placed in an FF region corresponding to a flip-flop relating to the cell in question. In step S50, both the placement of the flip-flops carried out in step S30 and the placement of the cells other than the flip-flops carried out in step S40 are improved throughout the placement region.

Finally, in step S60, an LSI layout is generated according to the cell placement obtained in step S50 and the generated LSI layout is provided. The processing is now completed.

Step S20, a step of generating FF netlists, is now described in detail.

Figure 2A:
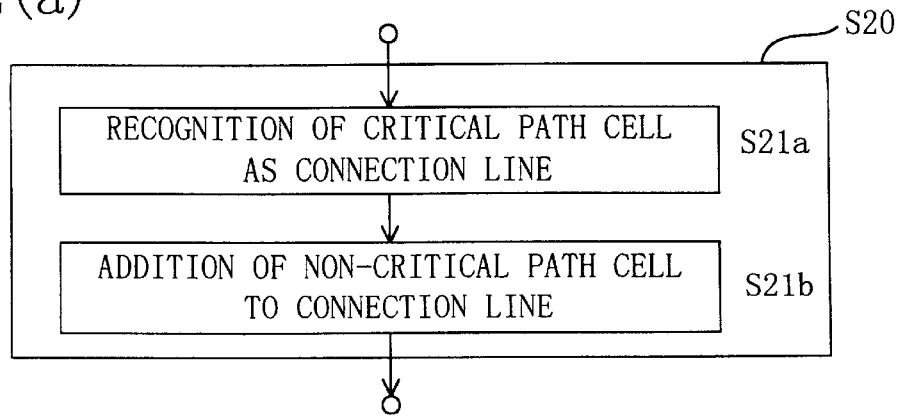
FIG. 2(a) shows a process of generating an FF netlist made up of flip-flops and a connection line which is assigned a weight (cell area) and FIGS. 2(a) and (c) show a process of generating an FF netlist by clustering in which a flip-flop is used as a seed.
Figure 2B:
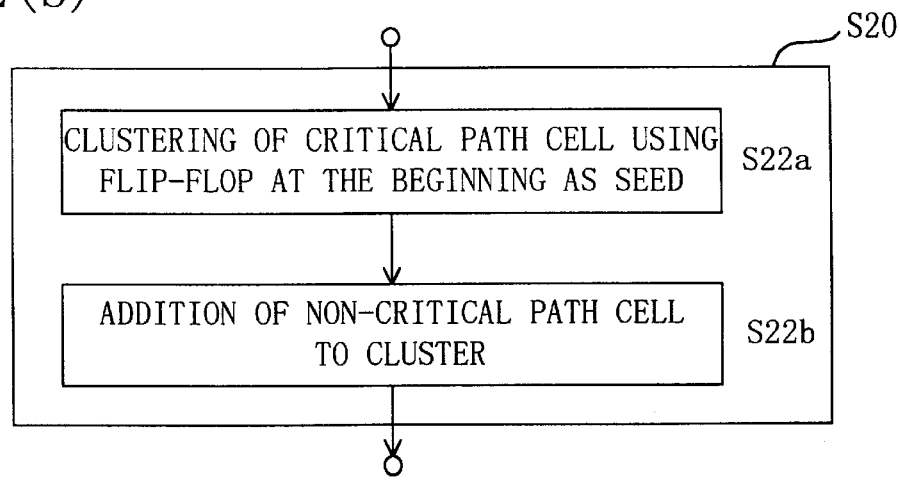

FIG. 2 is a flow chart showing steps of a process in step S20. FIG. 2(a) shows a process in which a connection line corresponding to a critical path is assigned a weight for cell deletion and an FF netlist, formed of flip-flops and weighted connection lines, is generated. FIGS. 2(a) and 2(b) show a process of generating an FF netlist by cluster generation (clustering) using a flop-flop as a seed.

Figure 3A:
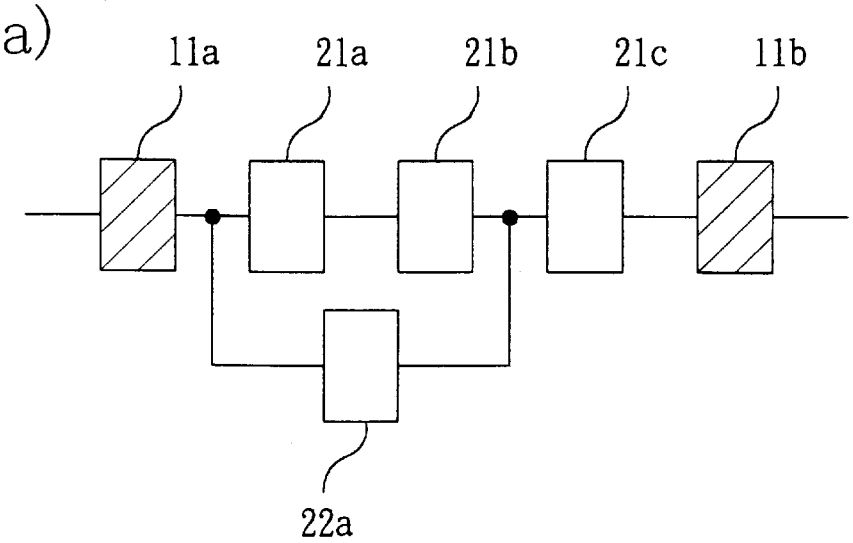
FIG. 3(a) is a given standard cell logic circuit.
Figure 11A:
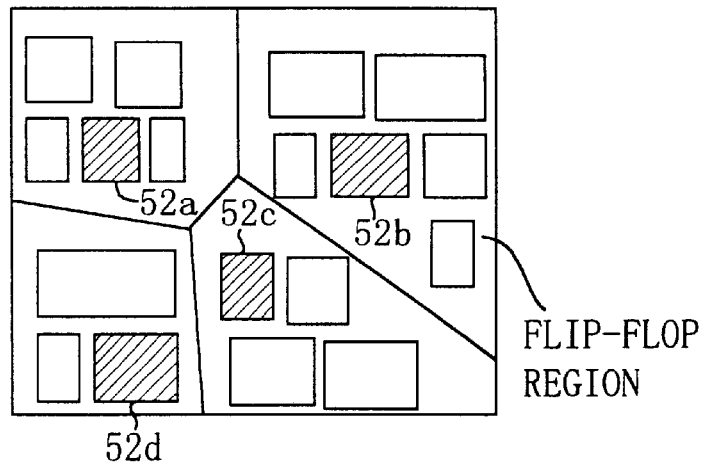
FIG. 11, comprised of FIGS. 11(a) and (b), is a diagram for describing a process of placing cells in an FF region and improving the placement in an LSI layout design method in accordance with an embodiment of the present invention.
Figure 11B:
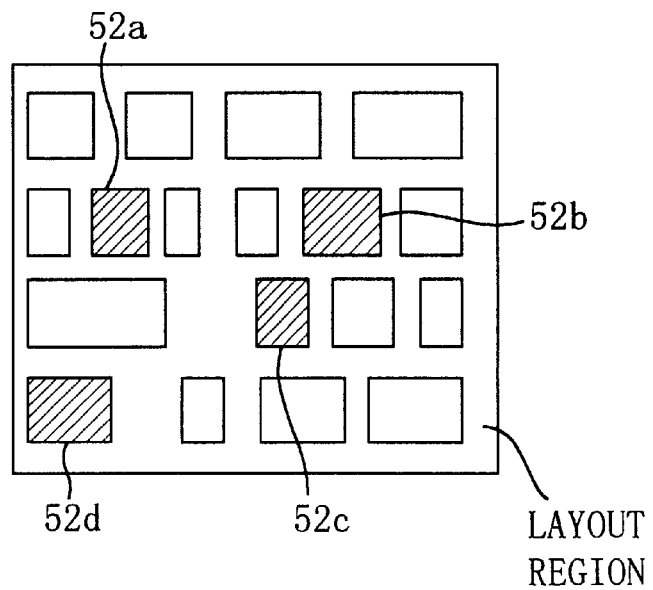

The FIG. 2(a) process is described with reference to FIG. 3. Suppose that the standard cell level netlist of step S10 gives a circuit as shown in FIG. 3(a). In FIG. 3(a), 11a and 11b are flip-flops. 21a, 21b, 21c, and 22a are cells. A critical path between flip-flops 11a and 11b is a route that passes through cells 21a, 21b, and 21c. Cells that belong to critical paths are critical path cells. Cells 21a, 21b, and 21c are critical path cells in the present embodiment. On the other hand, cells that do not belong to any of critical paths are non-critical path cells. Cell 22a is a non-critical path cell in the present embodiment.

Figure 3B:
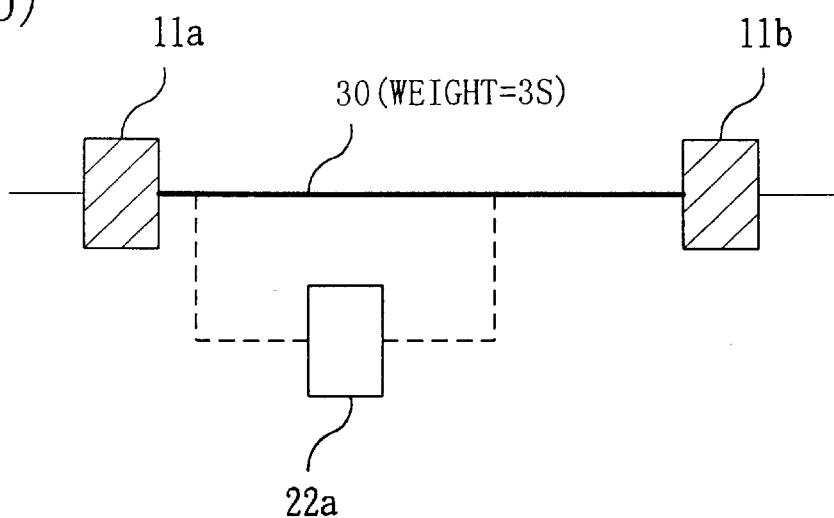
FIG. 3(b) is a diagram in which critical path cells are regarded as a connection line.

In step S21a, the critical path cells are regarded as a connection line, in other words the critical path cells are deleted. The sum of the areas of the deleted critical path cells is set to be a weight for a connection line corresponding to the critical path. By virtue of step S21a, the FIG. 3(a) circuit becomes a circuit shown in FIG. 3(b). In FIG. 3(b), connection line 30 replaces critical path cells 21a, 21b, and 21c. If each critical path cell 21a, 21b, and 21c has an area of S, this gives a weight of 3S to connection line 30. As can be seen from FIG. 3(b), non-critical path cell 22a becomes isolated by step S21a.

Figure 3C:
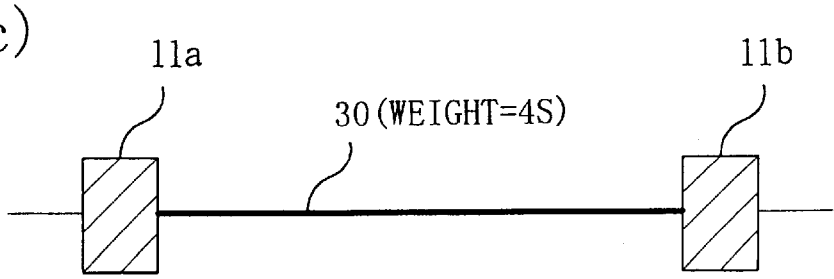
FIG. 3(c) is a diagram in which non-critical path cells are regarded as a connection line.

In step S21b, the area of a non-critical path cell is added to the weight of a connection line which belongs to a critical path in the vicinity of the non-critical path cell and the non-critical path cell is then removed. By step S21b, the FIG. 3(b) circuit becomes a circuit shown in FIG. 3(c). As shown in FIG. 3(c), non-critical path cell 22a is deleted, and the area of non-critical path cell 22a, S, is added to the current weight of connection line 30. As a result, the weight of connection line 30 is increased to 4S. This generates an FF netlist made up of flip-flips and a weighted connection line, taking each cell's area for a connection line weight.

The FIG. 2(b) process is now illustrated with reference to FIG. 4. Suppose that the standard cell level netlist of step S10 gives a circuit as shown in FIG. 3(a).

Figure 4A:
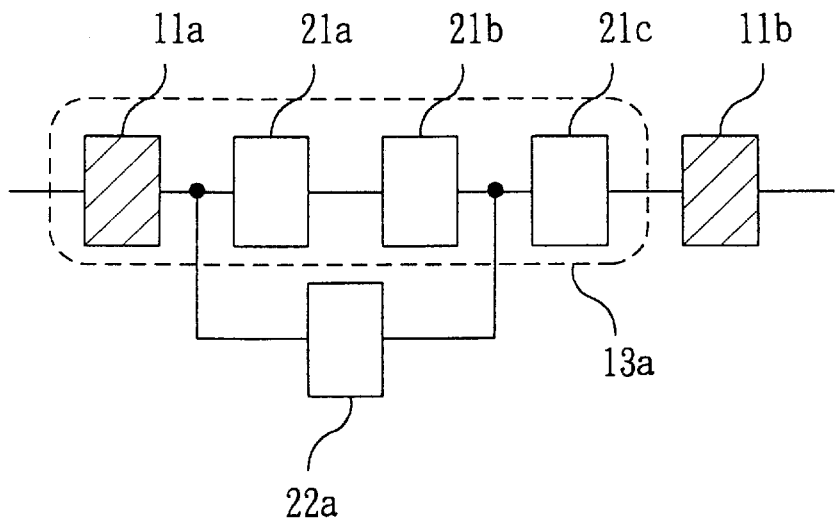
FIG. 4(a) shows clustering of critical path cells.

In step S22a, by using a flip-flip which provides a signal to a critical path (the beginning of the critical path) as a seed, clustering of critical path cells between flip-flops is carried out. FIG. 4(a) is a diagram showing clustering on the FIG. 3(a) circuit. Broken line shows a cluster (a flip-flop cluster) in which flip-flop 11a is a seed. Critical path cells 21a, 21b, and 21c are subjected to clustering to form flip-flop cluster 13a. At this time, the sum of the areas of the critical path cells incorporated into the flip-flop cluster is set to be the area of the flip-flop cluster.

Figure 4B:
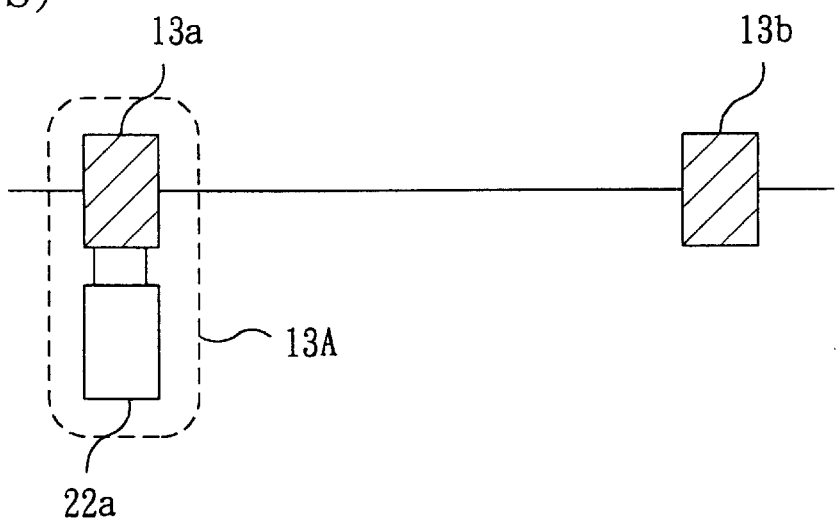
FIG. 4(b) shows clustering of non-critical path cells.
Figure 13A:
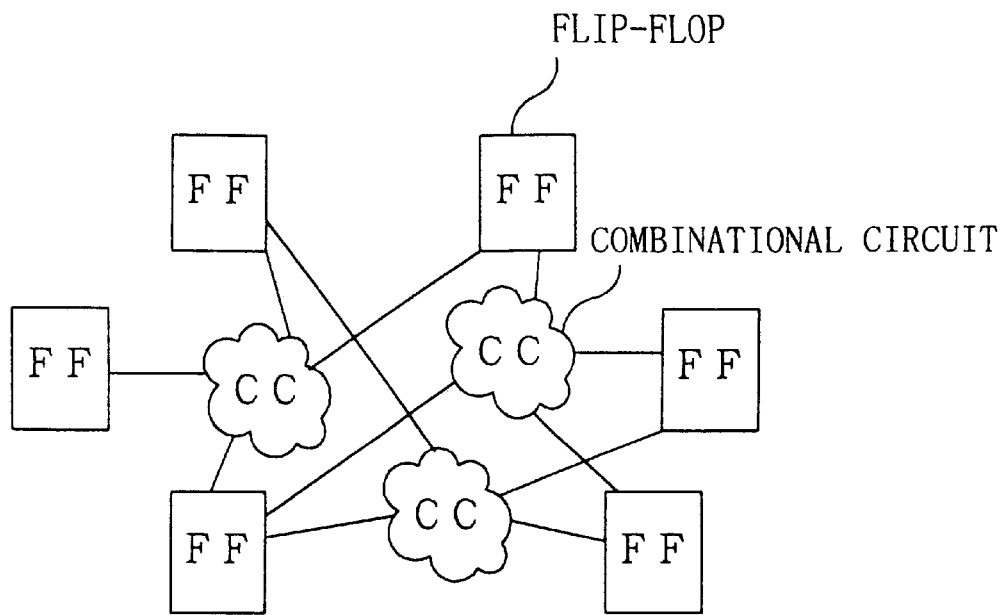
FIG. 13(a) shows a netlist at logic level and FIG. 13(b) shows a flip-flop connection relationship having an approximately complete graph form.
Figure 13B:
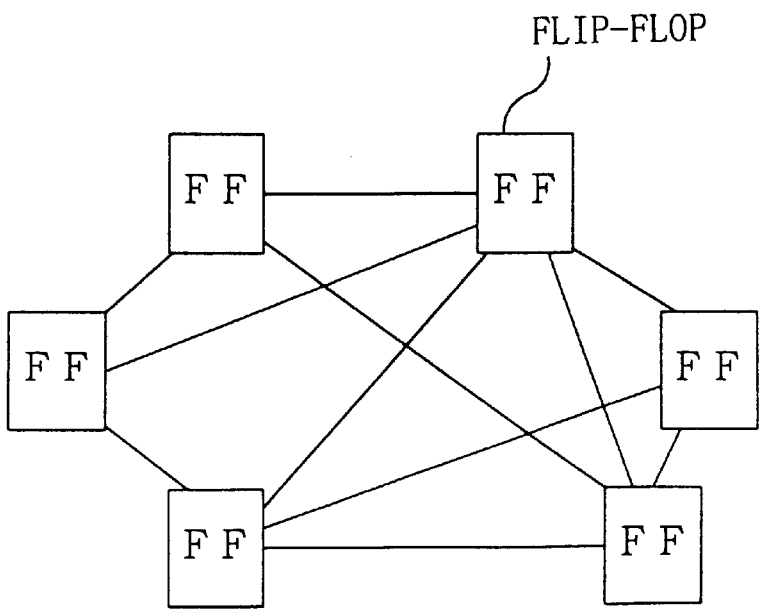

In step S22b, a non-critical path cell is added to the flip-flip cluster generated in step S22a to generate a new cluster. Referring to FIG. 4(b), 13a and 13b are flip-flop clusters. Broken line indicates a new clustering in which flip-flop cluster 13a is a seed. Non-critical path cell 22a is added generating a new flip-flop cluster 13A. At this time, non-critical path clustering is carried out in such a way as to equalize the areas of the flip-flop clusters.

Figure 4C:
FIG. 4(c) shows an FF netlist found by clustering.

As a result, an FF netlist at cluster level, shown in FIG. 4(c), can be generated. Each flip-flop cluster 13A and 13B has information about the area of the clustered cells.

Figure 2C:
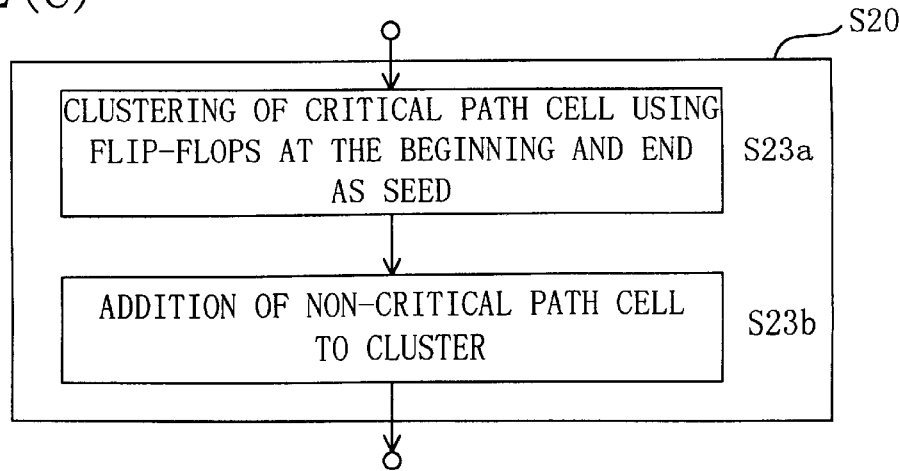

The FIG. 2(c) process is now described by reference to FIG. 5. Suppose that the standard cell level netlist of step S10 gives a circuit as shown in FIG. 3(a).

Figure 5A:
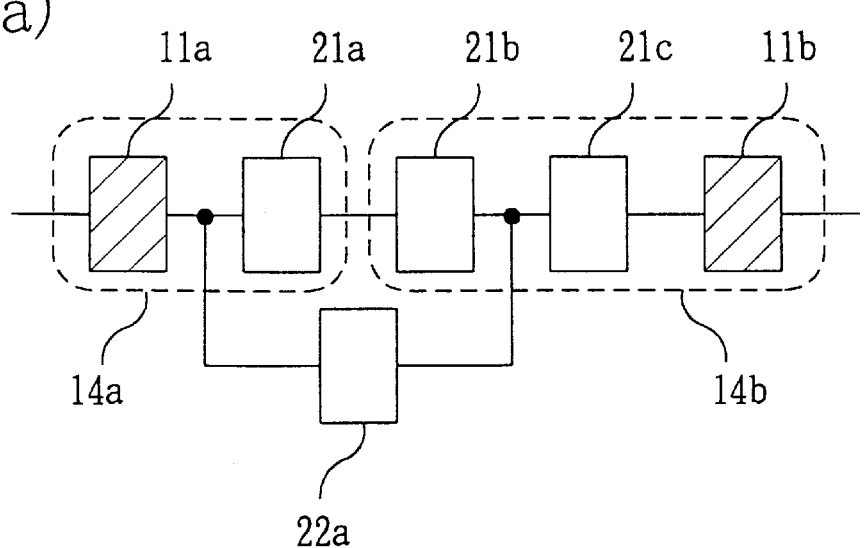
FIG. 5(a) shows clustering of critical path cells.

In step S23a, a flip-flip which provides signals to a critical path (the beginning of the critical path) and another flip-flop which receives signals from the critical path (the end of the critical path) each serve as a seed and clustering of critical path cells between the flip-flops is carried out. FIG. 5(a) shows a clustering on the FIG. 3(a) circuit. Both clustering in which flip-flop 11a is a seed and clustering in which flip-flop 11b is a seed, are shown by broken line in the figure. Clustering of critical path cell 21a is carried out, taking flip-flop 11a for a seed, whereby flip-flop cluster 14a is generated. On the other hand, clustering of critical path cells 21b and 21c is carried out, taking flip-flop 11b for a seed, whereby flip-flop cluster 14b is generated. The sum of the areas of the critical path cells incorporated into the flip-flop cluster is set to be the area of the flip-flop cluster.

Figure 5B:
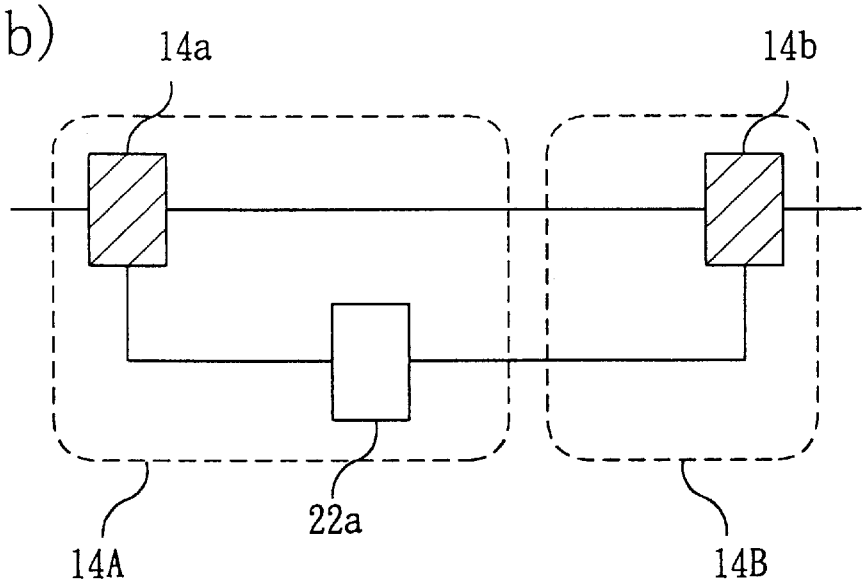
FIG. 5(b) shows clustering of non-critical path cells.

In step S23b, a non-critical path cell is added to the flip-flip cluster generated in step S23a to generate a new cluster. Referring to FIG. 5(b), 14a and 14b are flip-flop clusters. A clustering in which flip-flop cluster 14a is a seed and a clustering in which flip-flop cluster 14b is a seed, are shown by broken line. Non-critical path cell 22a is added to flip-flop cluster 14a to form a new flip-flop cluster 14A, and flip-flop cluster 14B is generated. At this time, non-critical path clustering is carried out in such a way as to equalize the areas of the flip-flop clusters.

Figure 5C:
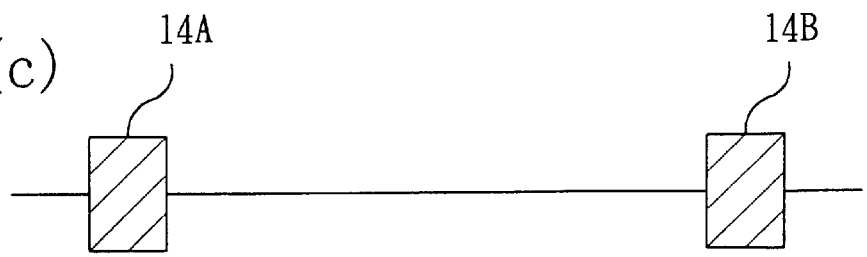
FIG. 5(c) shows an FF netlist found by clustering.

As a result, an FF netlist at cluster level, shown in FIG. 5(c), can be generated. Each flip-flop cluster 14A and 14B has information about the area of the clustered cells.

Step S30, a step of determining FF regions, is now described in detail.

Figure 6:
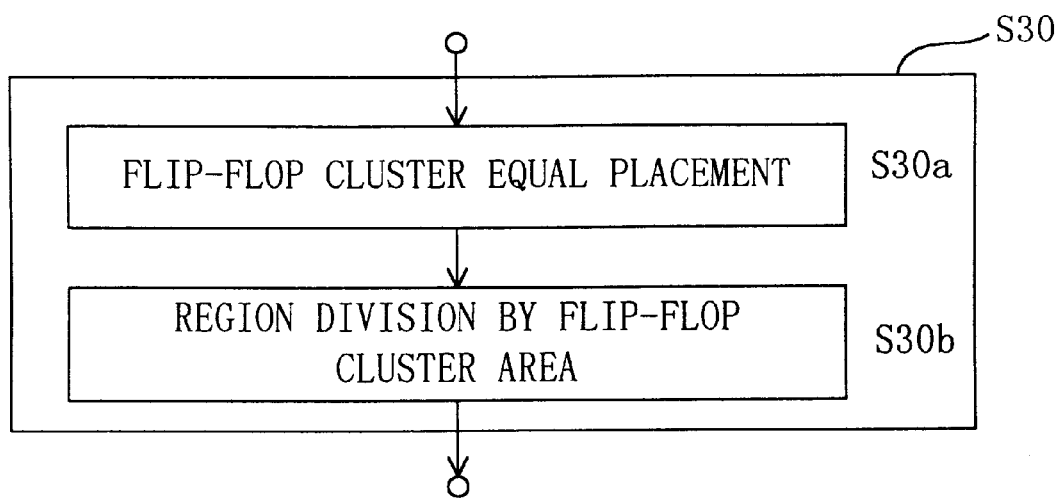
FIG. 6 is a flow chart of the successive steps of a process of determining FF regions in an LSI layout design method in accordance with an embodiment of the present invention.

FIG. 6 is a flow chart showing the step S30 process. In step S30a, an equal placement of flip-flops (flip-flop cluster) is carried out according to the FF netlist found in step S20. Such an equal placement may be found using a factor of dynamic model evaluation as shown in the formula (1).

$$\text{evaluation factor} = E^2 \qquad (1)$$

E: the length of connection line

In step S30b, the placement region is divided depending on the area of cells relating to each flip-flop and FF regions are determined. Here, a technique for determining FF regions from an FF netlist at cluster level, is described by reference to FIG. 7.

Figure 7A:
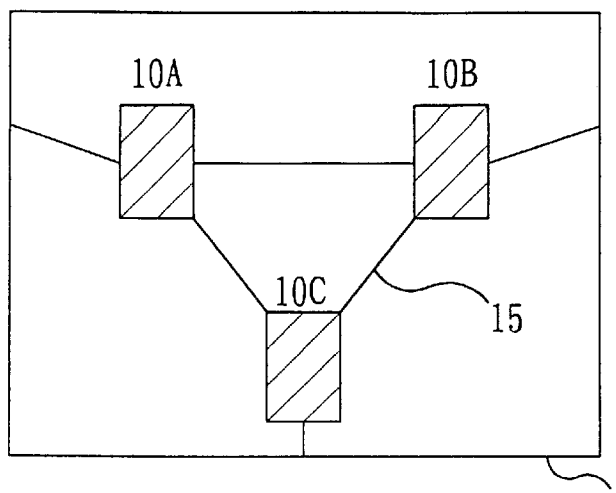
FIG. 7, comprised of FIGS. 7(a)–(c), is a diagram for describing a process of determining FF regions and shows flip-flop locations and FF regions.
Figure 7B:
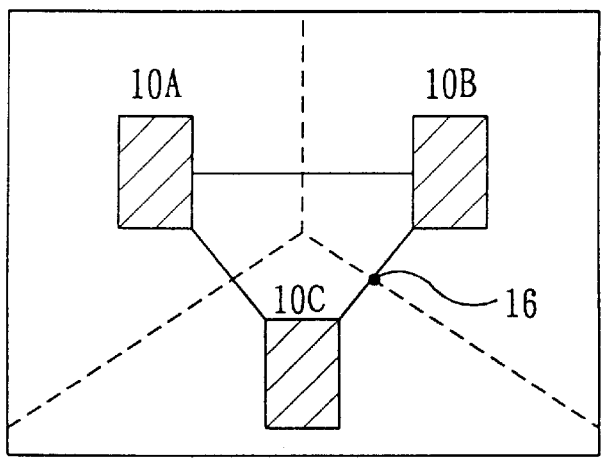
Figure 7C:
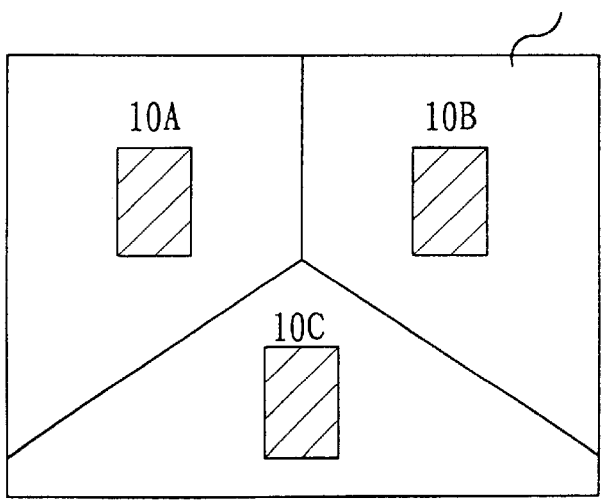

Suppose that placement locations for flip-flop clusters, shown in FIG. 7(a), are determined in step S30a. 10A, 10B, and 10C are flip-flop clusters. Each of flip-flop clusters 10A, 10B, and 10C has information about the area of cells clustered thereinto. As shown in FIG. 7(b), line 15, which establishes a connection between each flip-flop cluster, is divided according to the ratio of the cell area of one cluster to the cell area of another. A straight line, passing through division point 16 at right angles to line 15, is drawn. Regions, divided by the drawn line, becomes FF regions shown in FIG. 7(c).

When determining FF regions from an FF netlist including flip-flops and weighted connection lines, each flip-flop may be placed at intervals according to the connection line weight, and a region, divided by perpendicular bisectors of lines connecting between each flip-flop, is an FF region.

Step S40, a process of performing an initial placement within an FF region is now described in detail.

Figure 8:
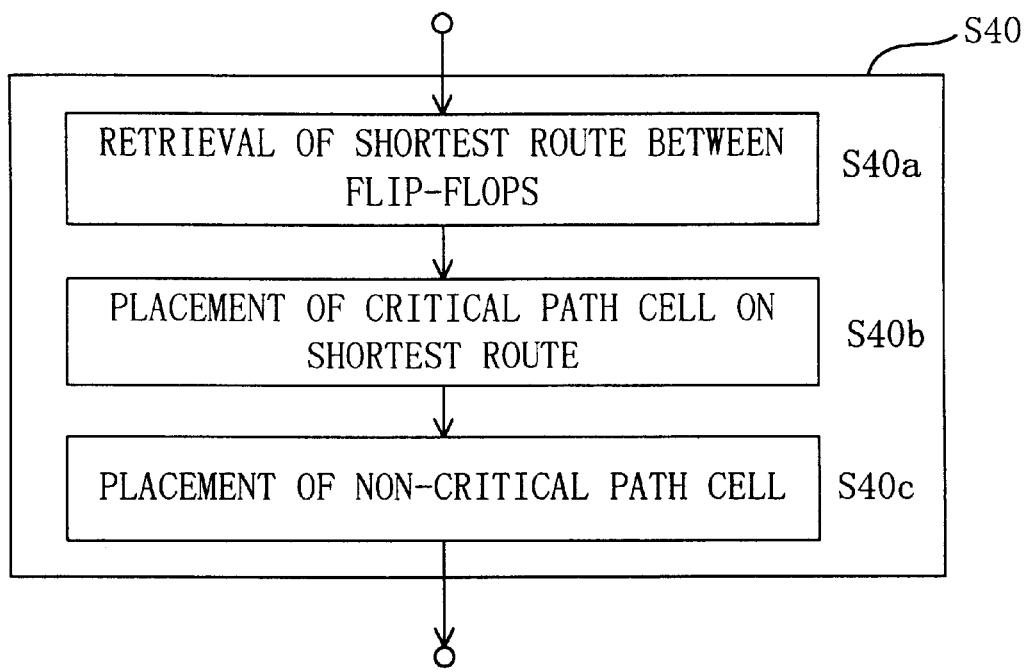
FIG. 8 is a flow chart of the successive steps of a process of performing an initial placement in an FF region in an LSI layout design method in accordance with an embodiment of the present invention.

FIG. 8 is a flow chart showing processing in step S40. In step S40a, a shortest route between flip-flops is found. In step S40b, cells that belong to a critical path, i.e., critical path cells, are placed in a shortest route found in step S40a between flip-flops which the beginning and end of the critical path. Finally, in step S40c, a non-critical path cell is placed in a free space in an FF region corresponding to a flip-flop relating to the non-critical path cell.

An LSI layout design technique according to the present embodiment is described by reference to FIGS. 9 to 11.

Figure 9A:
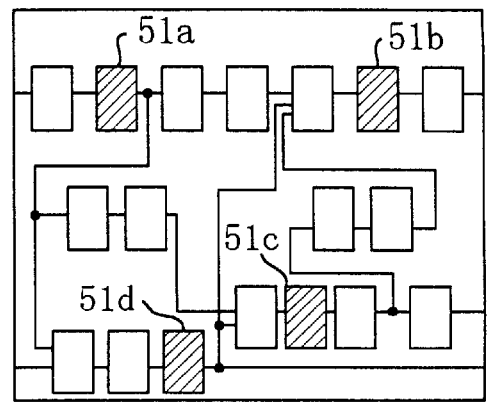
FIG. 9, comprised of FIGS. 9(a)–(c), is a diagram useful in understanding a process of generating an FF netlist in an LSI layout design method in accordance with an embodiment of the present invention.

FIG. 9(a) is a circuit diagram depicting a netlist of step S10. In FIG. 9(a), each block represents a cell, and a line establishing a connection between each block represents a connection line between each cell. 51a, 51b, 51c, and 51d are flip-flops which are hatched in the figure. The remaining cells, i.e., cells other than flip-flops 51a, 51b, 51c, and 51d, are combinational logic cells. Suppose here that a layout design is carried out according to the netlist shown in FIG. 9(a).

Figure 9B:
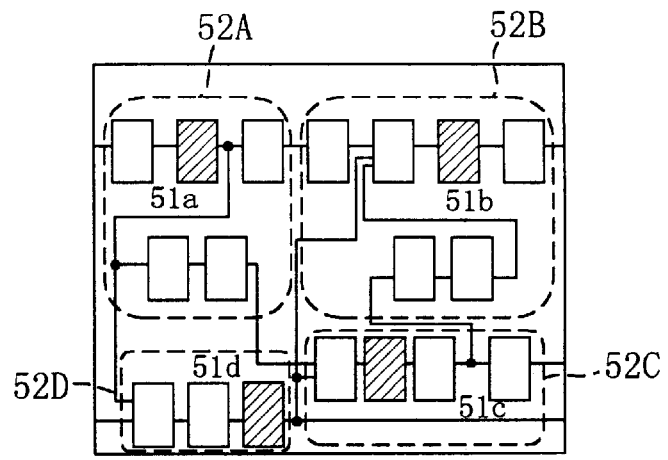
Figure 9C:
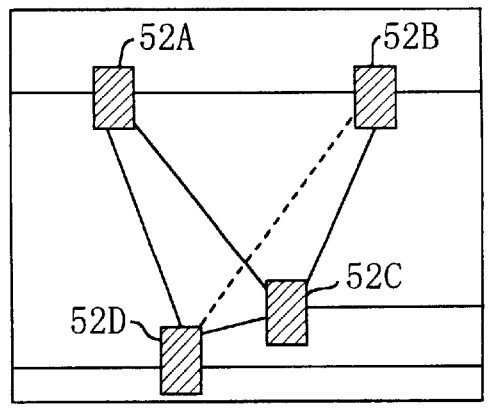

Based on the netlist shown in FIG. 9(a), an FF netlist is generated in step S20. Clustering of cells that belong to a critical path is carried out taking flip-flops that are the beginning and end of the critical path for seeds (see FIGS. 2(c) and 5). FIG. 9(b) is a diagram showing a result of the clustering on the FIG. 9(a) netlist, and flip-flip clusters 52A, 52B, 52C, and 52D are generated, their seeds being flip-flops 51a, 51b, 51c, and 51d, respectively. Subsequently, an FF netlist is generated from FIG. 9(b) wherein critical paths that do not require any timing constraints are deleted such that the FF netlist is prevented from being in the form of an approximately complete graph. For example, of critical paths among flip-flops, a critical path, the number of cell stages of which is less than two, is regarded a critical path that does not require timing constraints and therefore is deleted from the FF netlist. This generates an FF netlist as shown in FIG. 9(c). In FIG. 9(c), broken line represents the deleted critical path.

Figure 10A:
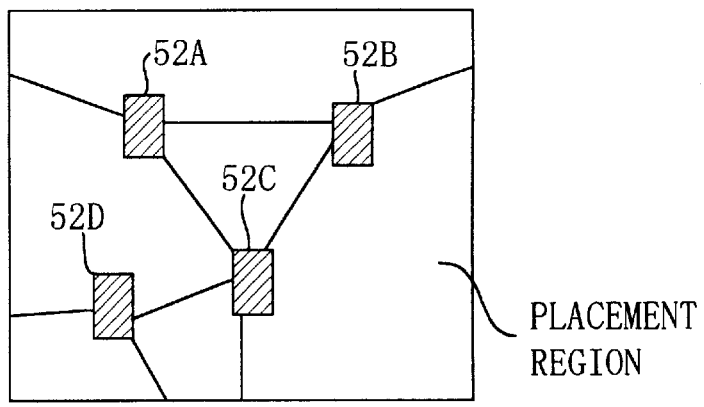
FIG. 10, comprised of FIGS. 10(a) and (b), is a diagram for describing a process of determining FF regions in an LSI layout design method in accordance with an embodiment of the present invention.
Figure 10B:
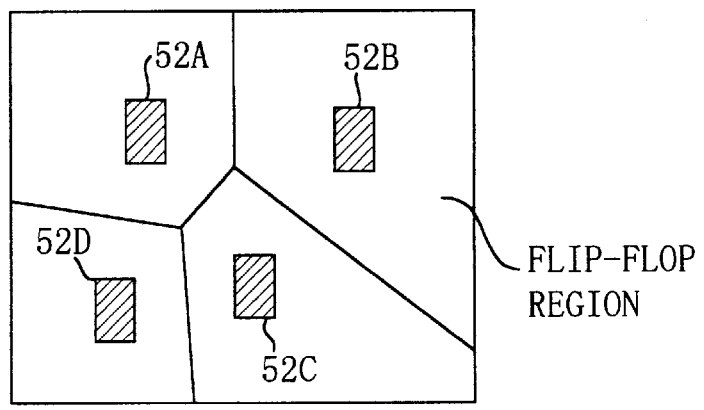

In step S30, FF regions are determined according to the FF netlist of FIG. 9(c). In the first place, an equal placement of flip-flop clusters 52A, 52B, 52C, and 52D is carried out in a placement region and the result of the equal placement is shown in FIG. 10(a). Next, the FF regions are determined according to the area information held in flip-flop clusters 52A, 52B, 52C, and 52D. Here, based on the FIG.9(c) FF netlist, a Volonoi diagram is prepared which represents influence areas of the clusters, and each influence area, i.e., a Volonoi region, is determined to be an FF region. FIG. 10(b) is a diagram showing the FF regions thus determined.

In step S40, an initial placement of cells, clustered to a corresponding flip-flop cluster, is carried out in each FF region and the result of the initial placement is shown in FIG. 11 (a). Further, in step S50, improvements in the placement are performed for fine adjustment of cell column and cell placement location, and a layout design is completed. FIG. 11(b) shows a result of the layout design.

As described above, in accordance with the LSI layout design technique of the present embodiment, an FF netlist descriptive of connections among flip-flops relating to the timing constraints, is generated, and according to the generated FF netlist, placement locations for the flip-flops are determined to implement a layout design. This makes it possible to provide an LSI layout design having the ability to meet the timing constraints without fail.

In an LSI circuit that is layout designed using the LSI layout design method of the present embodiment, cells in logical connection with a flip-flop are placed in the periphery of the flip-flop in a part of the circuit or in the entire circuit, and cells that belong to a critical path are placed in regions in the vicinity of a connection line between flip-flops that are the beginning and end of the critical path.

Figure 12A:
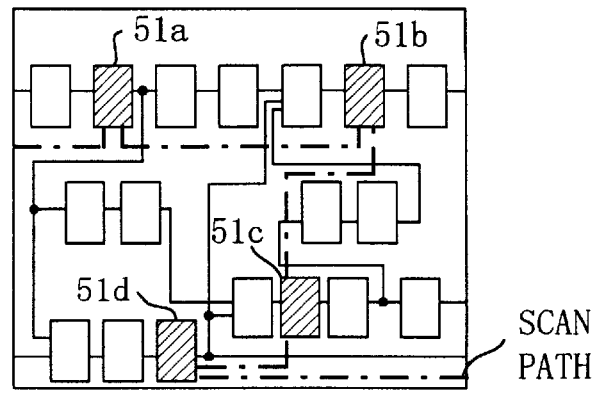
FIG. 12(a) shows a netlist with a scan path determined by logical design.
Figure 12B:
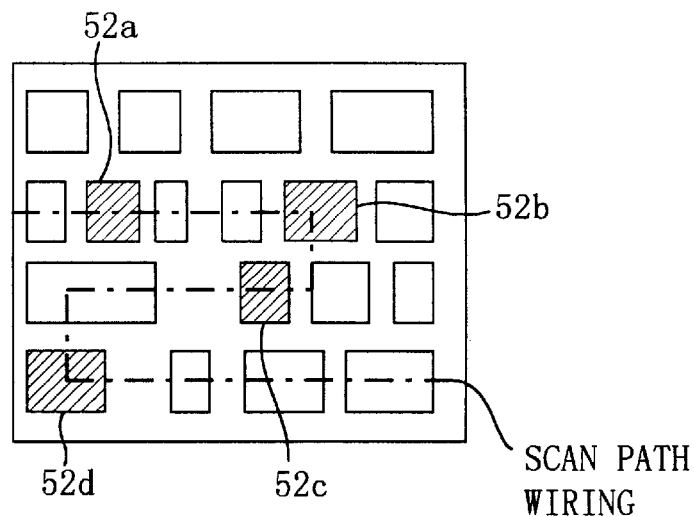
FIG. 12(b) shows an example of a layout that is layout designed on the basis of the FIG. 12(a) netlist by the embodiment of the present invention.
Figure 12C:
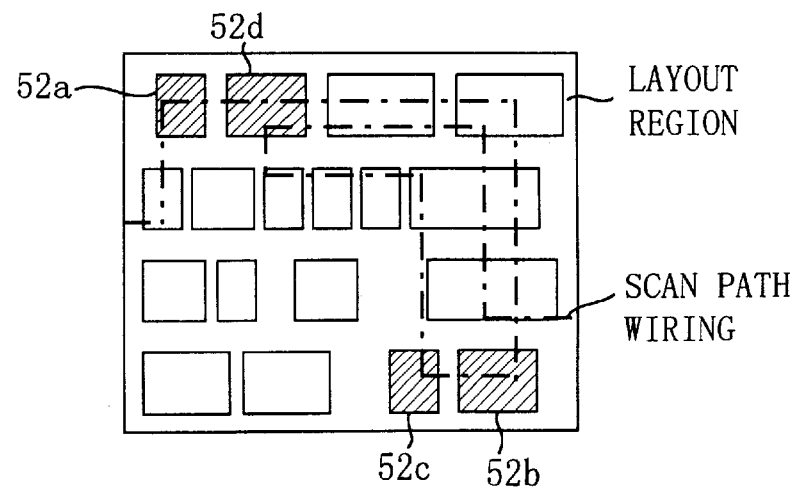
FIG. 12(c) is another netlist by a conventional method.

The present embodiment enables a placement of flip-flops along a signal flow. Scan path wiring after layout design approximately corresponds in form to one that was defined by logical design, without unnecessary bends. For example, if a scan path (see FIG. 12(a)) is determined for the netlist of FIG. 9(a), the wiring of the scan path will almost correspond in form to the FIG. 12(a) scan path in the event that layout design is carried out according to the present LSI layout design method (see FIG. 12(b)). On the other hand, for the case of a commonly-used LSI layout design technique, scan path wiring does not correspond in form to a scan path determined by logical design, therefore including unnecessary bends. In accordance with the present embodiment, the scan path wiring includes no unnecessary bends at all. This not only holds the increase in circuit area lower in comparison with prior art techniques but also facilitates delay adjustment of scan signals.

Further, in accordance with the present embodiment, the placement location of flip-flops does not concentrate. This prevents local concentration of flip-flop power consumption. Accordingly, the malfunction of LSI circuits due to a drop in the voltage can be prevented.

The invention claimed is:

1. An LSI layout design method comprising:
   (a) a first step of generating, on the basis of a netlist which represents connections among cells including flip-flops in a circuit that is designed, a flip-flop netlist which represents connections among flip-flops relating to timing constraints;
   (b) a second step of placing, according to said flip-flop netlist generated in said first step, flop-flops in a given placement region and determining a flip-flop region for each flip-flop where a cell relating to said flip-flop is to be placed; and
   (c) a third step of placing, in each flip-flop region determined in said second step, a cell relating to a corresponding flip-flop;
   wherein a layout design is performed according to said cells placement carried out in said third step, and
   said first step includes:
      (i) a step of regarding each critical path between flip-flops as a connection line, deleting cells that belong to said critical path from said netlist, and setting the sum of the areas of said deleted cells to be a weight for said connection line;
      (ii) a step of deleting from said netlist a cell that does not belong to any of said critical paths and adding the area of said deleted cell to the weight of a connection line corresponding to a critical path in close proximity to said deleted cell;
   wherein a flip-flop netlist, made up of flip-flops and a weighted connection line, is generated.

2. An LSI layout design method comprising:
   (a) a first step of generating, on the basis of a netlist which represents connections among cells including flip-flops in a circuit that is designed, a flip-flop netlist which represents connections among flip-flops relating to timing constraints;
   (b) a second step of placing, according to said flip-flop netlist generated in said first step, flop-flops in a given placement region and determining a flip-flop region for each flip-flop where a cell relating to said flip-flop is to be placed; and
   (c) a third step of placing, in each flip-flop region determined in said second step, a cell relating to a corresponding flip-flop;
   wherein a layout design is performed according to said cells placement carried out in said third step, and in said first step said flip-flop netlist is generated by clustering in which a flip-flop is used as a seed,
   said first step including:

(i) a step of incorporating cells that belong to a critical path between flip-flops, into a flip-flop cluster in which a flip-flop that is the beginning of said critical path is used as a seed and setting the sum of the areas of said incorporated cells to be an area for said flip-flop cluster; and (ii) a step of incorporating a cell that does not belong to any of said critical paths, into one of flip-flop clusters and adding the area of said cell to the area of said flip-flop cluster, in order of equalizing the areas of flip-flop clusters.

3. An LSI layout design method comprising:

(a) a first step of generating, on the basis of a netlist which represents connections among cells including flip-flops in a circuit that is designed, a flip-flop netlist which represents connections among flip-flops relating to timing constraints;

(b) a second step of placing, according to said flip-flop netlist generated in said first step, flop-flops in a given placement region and determining a flip-flop region for each flip-flop where a cell relating to said flip-flop is to be placed; and (c) a third step of placing, in each flip-flop region determined in said second step, a cell relating to a corresponding flip-flop;

wherein a layout design is performed according to said cells placement carried out in said third step, and in said first step said flip-flop netlist is generated by clustering in which a flip-flop is used as a seed, said first step including:

(i) a step of incorporating cells that belong to a critical path between flip-flops, either into a flip-flop cluster in which a flip-flop that is the beginning of said critical path is used as a seed or into a flip-flop cluster in which a flip-flop that is the end of said critical path is used as a seed and setting the sum of the areas of said incorporated cells to be an area for said flip-flop cluster; and (ii) a step of incorporating a cell that does not belong to any of said critical paths, into one of flip-flop clusters and adding the area of said cell to the area of said flip-flop cluster, in order of equalizing the areas of flip-flop clusters.

4. An LSI layout design method comprising:

(a) a first step of generating, on the basis of a netlist which represents connections among cells including flip-flops in a circuit that is designed, a flip-flop netlist which represents connections among flip-flops relating to timing constraints;

(b) a second step of placing, according to said flip-flop netlist generated in said first step, flop-flops in a given placement region and determining a flip-flop region for each flip-flop where a cell relating to said flip-flop is to be placed; and (c) a third step of placing, in each flip-flop region determined in said second step, a cell relating to a corresponding flip-flop;

wherein a layout design is performed according to said cells placement carried out in said third step, and said first step generating a flip-flop netlist including information about the area of cells relating to each of flip-flops;

said second step including:

(i) a step of performing an equal placement of flip-flops in a given placement region according to said flip-flop netlist generated in said first step; and (ii) a step of determining flip-flop regions by dividing said placement region according to said cell areas information included in said flip-flop netlist.

5. An LSI layout design method comprising:

(a) a first step of generating, on the basis of a netlist which represents connections among cells including flip-flops in a circuit that is designed, a flip-flop netlist which represents connections among flip-flops relating to timing constraints;

(b) a second step of placing, according to said flip-flop netlist generated in said first step, flop-flops in a given placement region and determining a flip-flop region for each flip-flop where a cell relating to said flip-flop is to be placed; and (c) a third step of placing, in each flip-flop region determined in said second step, a cell relating to a corresponding flip-flop;

wherein a layout design is performed according to said cells placement carried out in said third step, and said third step includes:

(i) a step of finding a shortest route between flip-flops placed in said second step;

(ii) a step of placing cells that belong to a critical path on said shortest route between flip-flops that are the beginning and end of said critical path; and (iii) a step of placing a cell that does not belong to any of critical paths, in a free region within a flip-flop region corresponding to a flip-flop relating to said cell.

* * * * *